(12) United States Patent
Uppenkamp et al.

(10) Patent No.: US 10,228,717 B2
(45) Date of Patent: Mar. 12, 2019

(54) METHOD FOR STABILIZING THE CLOCK FREQUENCY OF A MICROCONTROLLER

(71) Applicant: Endress + Hauser GmbH + Co. KG, Maulburg (DE)

(72) Inventors: Kaj Uppenkamp, Wehr (DE); Walter Rombach, Rheinfelden (DE); Franco Ferraro, Schworstadt (DE); Armin Wernet, Rheinfelden (DE)

(73) Assignee: ENDRESS+HAUSER SE+CO.KG, Maulburg (DE)

(*) Notice: Subject to any disclaimer, the term of this patent is extended or adjusted under 35 U.S.C. 154(b) by 9 days.

(21) Appl. No.: 14/652,256

(22) PCT Filed: Dec. 6, 2013

(86) PCT No.: PCT/EP2013/075743
§ 371 (c)(1),
(2) Date: Jun. 15, 2015

(87) PCT Pub. No.: WO2014/095409
PCT Pub. Date: Jun. 26, 2014

(65) Prior Publication Data
US 2015/0323957 A1 Nov. 12, 2015

(30) Foreign Application Priority Data
Dec. 19, 2012 (DE) .......... 10 2012 112 672

(51) Int. Cl.
*G06F 9/00* (2006.01)
*G06F 1/08* (2006.01)
(Continued)

(52) U.S. Cl.
CPC .............. *G06F 1/08* (2013.01); *G01D 21/00* (2013.01); *H03L 1/026* (2013.01); *H03L 7/099* (2013.01); *G01D 18/008* (2013.01)

(58) Field of Classification Search
CPC ........ G06F 1/08; G01D 21/00; G01D 18/008; H03L 1/026; H03L 7/099
(Continued)

(56) References Cited

U.S. PATENT DOCUMENTS 4,812,733 A     3/1989   Tobey
5,659,270 A *   8/1997   Millen .................. H03L 1/028
                                                              310/315
(Continued)

FOREIGN PATENT DOCUMENTS

CN         1721965 A     1/2006
CN         1760801 A     4/2006
(Continued)

OTHER PUBLICATIONS

International Search Report, EPO, The Netherlands, dated Feb. 13, 2014.
(Continued)

*Primary Examiner* — Aurel Prifti
(74) *Attorney, Agent, or Firm* — Bacon & Thomas, PLLC

(57) ABSTRACT

A method for stabilizing the clock frequency of a microcontroller associated with a field device of automation technology. The field device as a function of application is exposed to different process conditions, wherein the clock frequency of the microcontroller is ascertained at least two different temperature values, and/or at least two different voltage values. Based on the ascertained values, the dependence of the clock frequency of the microcontroller on temperature over a predetermined temperature- and/or frequency range and/or the dependence of the clock frequency of the microcontroller on voltage over a predetermined voltage- and/or frequency range is ascertained. The ascertained values are stored, and the influence of temperature and/or voltage on the clock frequency of the microcontroller (Continued)

Variable   T, at U = const.
Variable   U, at T = const.

is at least approximately compensated taking into considering the ascertained temperature dependence and/or the ascertained voltage dependence.

8 Claims, 3 Drawing Sheets

(51) Int. Cl.
    *G01D 21/00*     (2006.01)
    *H03L 1/02*     (2006.01)
    *H03L 7/099*     (2006.01)
    *G01D 18/00*     (2006.01)

(58) Field of Classification Search
    USPC ............... 712/229; 713/322, 300, 340, 400; 374/141; 327/160, 154; 331/158; 310/315; 702/64
    See application file for complete search history.

(56) References Cited

U.S. PATENT DOCUMENTS

| | | | | |
|---|---|---|---|---|
| 5,668,506 A * | 9/1997 | Watanabe | ............... | H03L 1/025 310/315 |
| 6,160,458 A * | 12/2000 | Cole | ............... | H03L 1/026 331/158 |
| 6,249,173 B1 * | 6/2001 | Nakaizumi | ............... | G01R 31/31709 257/E23.08 |
| 6,311,287 B1 | 10/2001 | Dischler | | |
| 6,850,125 B2 * | 2/2005 | Norman | ............... | G01K 15/00 331/65 |
| 7,062,933 B2 * | 6/2006 | Burns | ............... | H01L 23/34 257/E23.08 |
| 7,148,763 B2 * | 12/2006 | Sutardja | ............... | H03B 5/04 331/116 FE |
| 7,455,450 B2 * | 11/2008 | Liu | ............... | G01K 7/203 331/57 |
| 7,551,016 B2 | 6/2009 | Bracamontes del Toro | | |
| 7,865,755 B2 * | 1/2011 | Engl | ............... | G06F 1/08 713/400 |
| 8,031,024 B1 * | 10/2011 | Zaslavsky | ............... | H03L 1/026 331/158 |
| 8,037,445 B2 * | 10/2011 | Poirier | ............... | G01R 31/2884 374/141 |
| 8,138,846 B2 * | 3/2012 | Seth | ............... | H03L 1/027 327/160 |
| 8,237,482 B2 * | 8/2012 | Ge | ............... | H03L 7/00 327/154 |
| 2004/0246809 A1 | 12/2004 | Sutardja | | |
| 2005/0107967 A1 * | 5/2005 | Patel | ............... | G01R 31/3004 702/64 |
| 2008/0136538 A1 | 6/2008 | Marques | | |
| 2008/0294296 A1 * | 11/2008 | Liu | ............... | G05D 23/1917 700/300 |
| 2012/0066535 A1 * | 3/2012 | Naffziger | ............... | G06F 1/206 713/340 |
| 2012/0110352 A1 * | 5/2012 | Branover | ............... | G06F 1/206 713/300 |
| 2012/0166839 A1 * | 6/2012 | Sodhi | ............... | G06F 1/206 713/322 |
| 2012/0169399 A1 * | 7/2012 | Li | ............... | H03K 3/011 327/512 |
| 2014/0095912 A1 * | 4/2014 | Hurd | ............... | G06F 1/3234 713/323 |
| 2014/0317389 A1 * | 10/2014 | Wenisch | ............... | G06F 1/20 712/229 |

FOREIGN PATENT DOCUMENTS

| | | |
|---|---|---|
| CN | 101111812 A | 1/2008 |
| CN | 101241392 A | 8/2008 |
| DE | 2742908 A1 | 3/1979 |
| DE | 202011052538 U1 | 4/2012 |
| EP | 0712064 B1 | 5/1996 |

OTHER PUBLICATIONS

English Translation of the International Preliminary Report on Patentability, WIPO, Geneva, CH, dated Jul. 2, 2015.

* cited by examiner

METHOD FOR STABILIZING THE CLOCK FREQUENCY OF A MICROCONTROLLER

TECHNICAL FIELD

The invention relates to a method for stabilizing the clock frequency of a microcontroller associated with a field device of automation technology. The field device is preferably a sensor or an actuator for determining and/or monitoring at least one process variable. Sensors for process automation technology are manufactured and sold by Endress+Hauser in a wide variety of embodiments.

BACKGROUND DISCUSSION

Sensors (and actuators) have usually at least two microcontrollers, wherein e.g. in the case of a sensor a process side microcontroller is associated with the sensor element and a transmitter side microcontroller is associated with the measurement transmitter. As a rule, measurement data representing the process variable are transmitted from the process side microcontroller to the transmitter side microcontroller, while mostly parameter data or sensor-specific identifying data are transmitted from the transmitter side microcontroller to the process side microcontroller. The data transmission, respectively communication, between the two microcontrollers is usually asynchronous. The communication occurs e.g. via a UART interface.

Problematic in the case of the asynchronous communication is that the clock frequency of a microcontroller is dependent on temperature fluctuations and voltage oscillations. Consequently in the case of a too strong relative drift of the clock frequencies of the two microcontrollers, an asynchronous communication or a time/frequency measurement can become unusable. It is thus necessary to keep the internally produced clock frequencies of the microcontrollers stable.

Usual in this connection is to keep the clock frequency, respectively the clock signal, of a microcontroller stable via an additional, stable clock frequency. For example, the additional stable clock frequency is provided by a clock crystal, wherein a clock crystal is distinguished by a lower temperature dependence. Disadvantageous in the case of the known solution is the extra costs caused by the additional clock crystal. Furthermore, the clock crystal requires additional space, a feature which is problematic in many fields of technology—for instance in automation technology—due to the continuing drive to miniaturize the sensors.

SUMMARY OF THE INVENTION

An object of the invention is to provide a method, with which the clock frequency of a microcontroller is effectively stabilized.

For the purpose of stabilizing the clock frequency of a microcontroller, which is associated with a field device of automation technology—wherein the field device as a function of application is exposed to different process conditions—the following solution of the invention is provided: the clock frequency of the microcontroller is ascertained at at least two different temperature values and/or at at least two different voltage values of the supply voltage, based on the ascertained values, the dependence of the clock frequency of the microcontroller on temperature over a predetermined temperature- and/or frequency range and/or the dependence of the clock frequency of the microcontroller on voltage over a predetermined voltage- and/or frequency range is ascertained, the ascertained values are stored, and the influence of temperature and/or voltage on the clock frequency of the microcontroller is at least approximately compensated taking into considering the ascertained temperature dependence and/or the ascertained voltage dependence.

Via the method of the invention, the temperature dependence and, in given cases, the voltage dependence of the clock frequency of the clock of a microcontroller can be significantly reduced. Therefore, the quality of the communication between two microcontrollers is greatly improved.

Conventional microcontrollers are today so designed that at least the temperature, especially the chip temperature, can be self-sufficiently measured. An example is the microcontroller-family MSP430 of Texas Instruments. In many cases, the microcontrollers of today are also able to detect the supply voltage. Therewith, the two disturbance variables, which can have a considerable influence on the clock frequency of a microcontroller, are known. By an adjustment, the influence of these disturbance variables can at least be reduced, respectively minimized.

In connection with the invention, it is especially provided that the temperature dependence and/or voltage dependence of the clock frequency of the microcontroller are/is ascertained via a matching test during the manufacturing. In order to ascertain the temperature dependence of the clock frequency, the microcontroller is exposed to different temperatures; then, in each case, the measured clock frequency is stored as a function of temperature. Thus, the measured clock frequency is matched to the temperature, at which it occurs. Analogously, the voltage dependence of the clock frequency is ascertained, in each case, at constant temperature.

In an advantageous form of embodiment, the ascertained temperature dependence and/or the ascertained voltage dependence of the clock frequency of the microcontroller are/is stored in tabular form or in the form of a matching function, especially in the form of a linear relationship.

In an advantageous further development of the method of the invention, not every microcontroller of a certain type is subjected to the above described matching method. Rather, the ascertaining of the temperature dependence and/or the voltage dependence of the clock frequency of the microcontroller occurs by random sampling. Then, the temperature dependence and/or the voltage dependence ascertained in this manner are/is used for stabilizing the clock frequency of a large number of similar microcontrollers.

As already earlier described, it is provided that the microcontroller for the purpose of ascertaining the temperature- and/or voltage dependence is exposed to different temperatures and/or supplied with different voltages.

For the matching test, preferably a frequency generator arranged insulated from the microcontroller is applied, which produces a reference frequency, which is at least approximately constant and/or preferably lower than the clock frequency of the microcontroller. This reference frequency is fed to the microcontroller and measured as test frequency.

Then, the different temperature values of the microcontroller are measured at voltage held constant, wherein in the microcontroller the test frequencies belonging to the different temperature values are ascertained. At least in the case of a deviation of the test frequency from the reference frequency, the ascertained test frequency value and/or a corresponding frequency change value and/or the correspondingly changed clock frequency are/is stored as a function of measured temperature value.

Moreover, it is provided that the voltage dependence of the microcontroller in the case of supplying the microcontroller with different supply voltages is ascertained. In such case, the temperature is, in each case, held constant.

In an alternative embodiment of the method of the invention, it is provided that a defined clock frequency of the microcontroller at a defined temperature of the microcontroller is predetermined or ascertained, that the defined clock frequency of the microcontroller is supplied to a matching tester, which is thermally insulated from the microcontroller that the microcontroller is brought to a changed temperature, which deviates from the defined temperature of the microcontroller, that a change of the defined clock frequency caused by the temperature change is counteracted until the clock frequency at the changed temperature again corresponds to the defined clock frequency, and that the corresponding change of the defined clock frequency of the microcontroller is stored as a function of changed temperature.

Moreover, it is provided that the clock frequency of the microcontroller is changed via a trial/error process until the defined clock frequency is reached again.

In order to be able to ascertain the dependence of the clock frequency on both disturbance variables exactly, the voltage is held constant during the changing of the temperature of the microcontroller. While changing the supply voltage, the temperature of the microcontroller is kept constant. Especially, the temperature of the microcontroller is determined by measuring the temperature of the chip, on which the microcontroller is arranged.

Especially advantageous in connection with the invention is when the microcontroller is clocked via a tunable oscillator, especially a digitally controlled oscillator (DCO). An advantage of using a DCO is that no external clock signal producer is required. Furthermore, different frequencies can be set, and it is possible during the run time of a program to switch between different frequencies. Thus, switching can occur, for example, between the following clock frequencies: 1 MHz, 8 MHz, 12 MHz and 16 MHz.

BRIEF DESCRIPTION OF THE DRAWINGS

The invention will now be explained in greater detail based on the appended drawing, the figures of which show as follows.

DETAILED DISCUSSION IN CONJUNCTION WITH THE DRAWINGS

Figure 1:
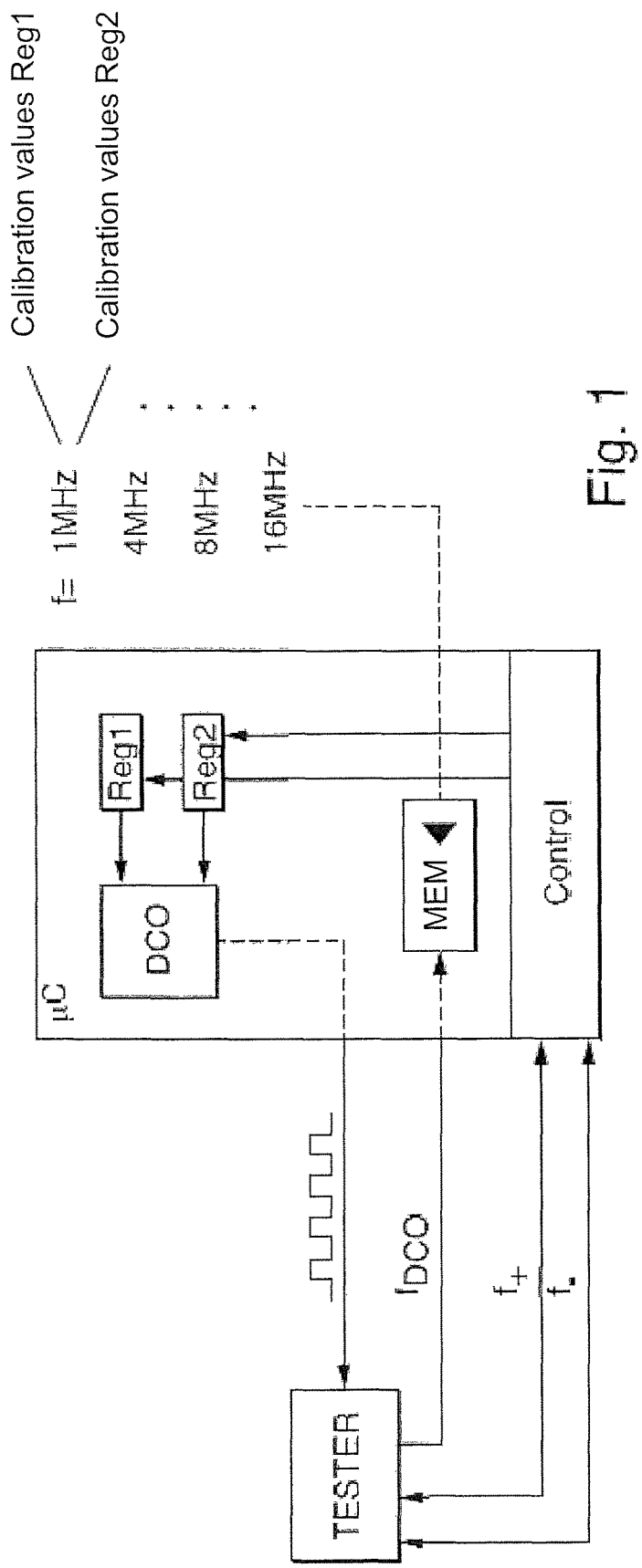
FIG. 1 is a block diagram illustrating a first method for stabilizing the clock frequency of a microcontroller.

FIG. 1 shows a block diagram illustrating a first method for stabilizing the clock frequency of a microcontroller μC. For this, a defined clock frequency fDCO of the microcontroller μC is predetermined or ascertained at a defined temperature T1 of the microcontroller μC. In the illustrated case, the microcontroller μC is clocked via a tunable oscillator DCO, respectively an internal clock signal producer DCO, especially a digitally controlled oscillator DCO. Via the tunable oscillator DCO, different clock frequencies f can be set, here 1 MHz, 4 MHz, 8 MHz, 16 MHz.

The defined clock frequency fDCO (e.g. 1 MHz) of the microcontroller μC is supplied to a matching tester TESTER, which is thermally insulated from the microcontrollers μC. Then, the microcontroller μC is brought to a changed temperature T2, which deviates from the defined temperature T1 of the microcontroller μC. A change of the defined clock frequency fDCO caused by the temperature change T2-T1 is counteracted until the clock frequency of the microcontroller μC at the changed temperature T2 returns to the defined clock frequency fDCO. Preferably, the clock frequency fDCO of the microcontroller μC is changed via a control unit CONTROL in a trial/error process until the defined clock frequency fDCO is reached again. The frequency values, respectively the frequency change values, ascertained at the individual temperature values T1, T2 . . . during the test phase are written by the control unit CONTROL into the memory MEM. As a function of measured temperature values T1, T2 . . . , the control unit CONTROL subsequently writes during the operational phase of the microcontroller μC the ascertained frequency values, respectively frequency change values, into the register Reg1, Reg2 . . . , which operate the tunable oscillator DCO correspondingly.

During the temperature change method in the test phase, the voltage U of the microcontroller μC is kept constant. Preferably, for the temperature determination of the microcontroller μC, the temperature of the chip, on which the microcontrollers μC is arranged, is measured. Analogously ascertained during the test phase is the dependence of the frequency of the microcontroller μC on changes of the supply voltage U1, U2 . . . , so that, in given cases, also a corresponding frequency matching dependent on the supply voltage U1, U2 . . . can occur during the operational phase.

In the test phase, the frequency matching is preferably performed via a trial/error process. This is shown in FIG. 1 via the frequency inputs f+, f−. The changes of the clock frequency fDCO ascertained as a function of temperature T are stored in the memory unit MEM as a function of measured temperature values T1, T2, . . . . In the simplest case, intermediate values are ascertained via a matching line or a matching function. The matching test in the test phase occurs preferably during the manufacturing.

Figure 2:
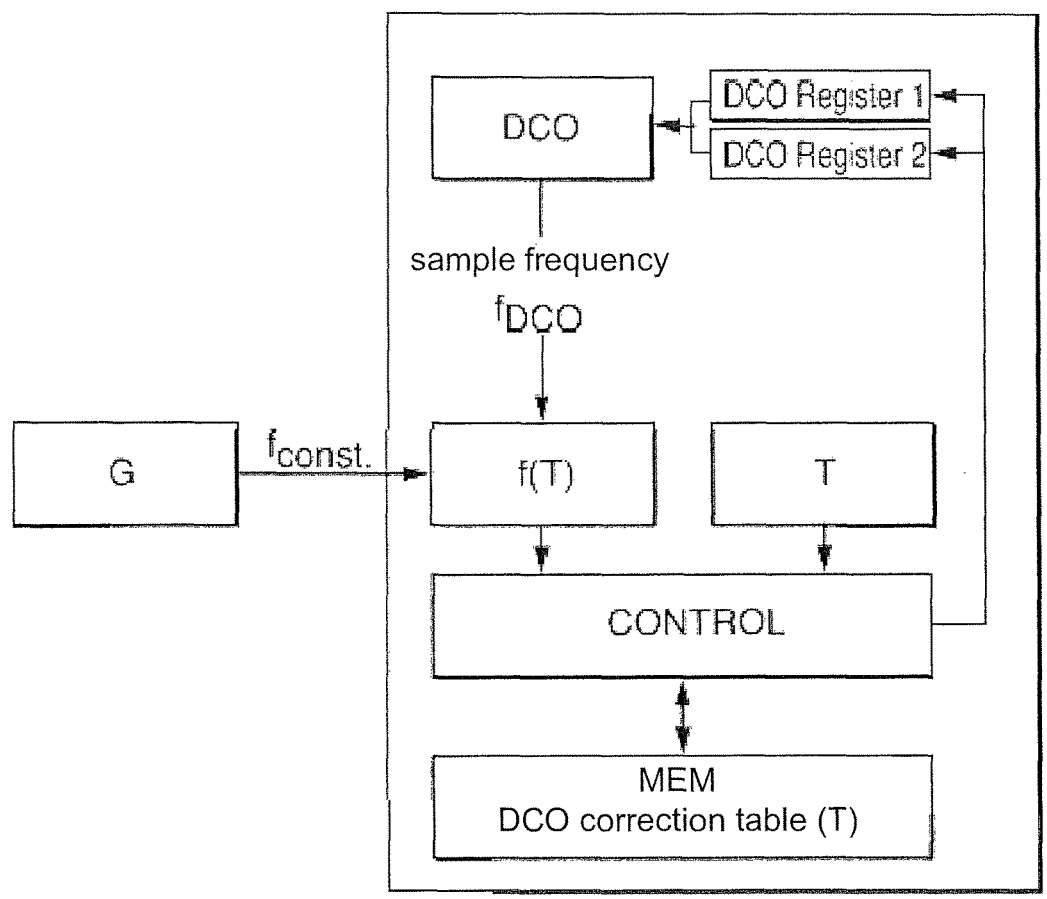
FIG. 2 is a block diagram illustrating a second alternative method for stabilizing the clock frequency of a microcontroller.

FIG. 2 shows a block diagram for an alternative method for stabilizing the clock frequency of a microcontroller μC. For the matching test, which preferably is again performed during the manufacturing phase, a frequency generator, respectively external clock signal generator G arranged thermally insulated from the microcontroller μC is applied. The frequency generator G produces a reference frequency fconst, which is at least approximately constant. Preferably, the reference frequency fconst is lower than the sample frequency f of the microcontroller μC. The reference frequency fconst is fed to the microcontroller μC and measured as test frequency f(T) in the microcontroller μC by means of a frequency meter FM. The measured test frequency f(T) is stored in the memory MEM in a correction table as a function of the respectively measured temperature T.

Then, the microcontroller μC is exposed during the matching test to a number of different temperature values T1, T2, . . . . The temperature values T1, T2 . . . of the microcontroller μC are measured with voltage U held constant. Taken as temperature T of the microcontroller μC is preferably the chip temperature. In the microcontroller μC, the test frequencies f(T1), f(T2) . . . belonging to the different temperature values T1, T2 . . . are ascertained. In the case of a deviating of the test frequency f(T) from the reference frequency fconst, the ascertained test frequencies f(T1), f(T2) . . . and/or the corresponding frequency change values and/or the correspondingly changed clock frequencies, respectively sample frequencies, are stored as a function of the measured temperature values T1, T2, . . . . An analogous matching test is then performed for ascertaining the voltage dependence of the microcontroller μC. For this, the microcontroller μC is supplied at constant temperature T with different supply voltages U1, U2, . . . .

During the later operational phase of the microcontroller μC, the earlier determined temperature- and/or voltage dependence of the microcontroller μC, which is usually stored in a correction table, are/is used for correction of the clock frequency fDCO.

Figure 2A:
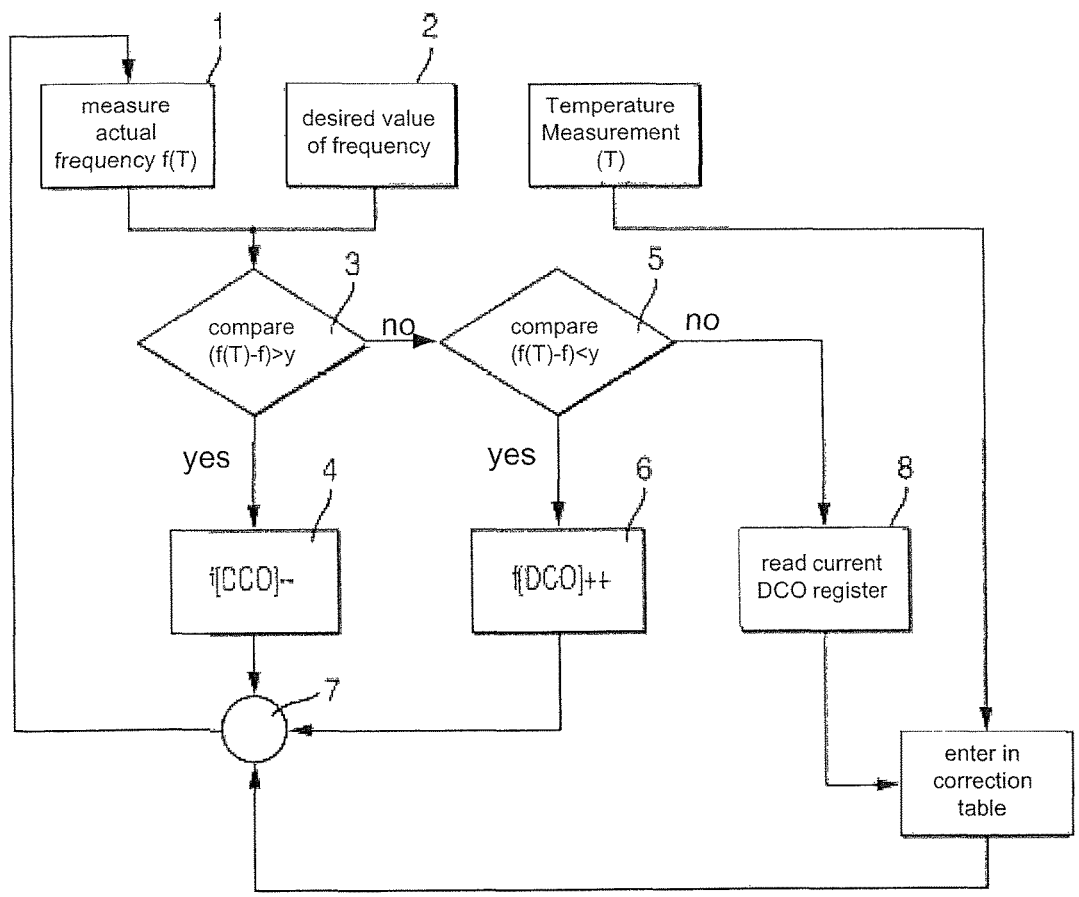
FIG. 2a is a flow diagram illustrating a method for determining the correction table.

FIG. 2a shows a flow diagram, which illustrates the method for ascertaining the values of the correction table during the test phase. The frequency f(T) measured at point 1 and the frequency desired value fconst predetermined at point 2 are compared with one another at the program point 3. If the difference between the measured frequency f(T) and the predetermined frequency desired value fconst is greater than a predetermined value x, then at point 4 the frequency of the internal clock, respectively of the oscillator DCO, is reduced. If the difference between the measured frequency f(T) and the predetermined frequency desired value fconst is smaller than the negative predetermined value x, which is checked at point 5, then the frequency fDCO of the clock DCO is increased at point 6. If the two tests at point 3 and point 5 are negative, then the current register of the internal clock DCO is read at point 8. The ascertained frequency value fDCO is stored in the correction table as a function of temperature T. During a following operational phase of the microcontroller PC, the ascertained temperature dependent frequency values f(T1), f(T2) . . . are used for operating the clock DCO. In such case, the temperature T of the microcontroller μC is preferably measured on the chip, on which the microcontrollers μC is arranged.

The invention claimed is:

1. A method for stabilizing the clock frequency of a microcontroller associated with a field device of automation technology, the field device as a function of application is exposed to different process conditions, comprising the steps of:
   ascertaining a dependence of the clock frequency of the microcontroller on temperature over a predetermined temperature-range and a dependence of the clock frequency of the microcontroller on voltage over a predetermined voltage-range, wherein
   a constant reference frequency is produced with a frequency generator, which is insulated from the microcontroller;
   the reference frequency is fed to the microcontroller and the reference frequency is measured as a test frequency;
   different temperature values of the microcontroller are measured at voltage held constant;
   the test frequencies belonging to the different temperature values are ascertained;
   the ascertained test frequency values are stored in dependency of the measured temperature value; and
   the voltage dependence of the microcontroller is ascertained by supplying the microcontroller with different supply voltages;
   storing the ascertained temperature dependence and voltage dependence of the clock frequency; and
   compensating for an influence of temperature and/or voltage on a clock frequency of the microcontroller, taking into consideration the ascertained temperature dependence and the ascertained voltage dependence in such a way that the frequency is kept stable under varying temperatures and voltages.

2. The method as claimed in claim 1, wherein:
the temperature dependence and voltage dependence of the clock frequency of the microcontroller are ascertained during manufacturing.

3. The method as claimed in claim 1, wherein:
the ascertained temperature dependence and the ascertained voltage dependence of the clock frequency of the microcontroller, are stored in form a table, the table storing the measured clock frequencies as a function of the corresponding measured voltages and temperatures.

4. The method as claimed in claim 1, wherein:
the ascertaining of the temperature dependence and the voltage dependence of the clock frequency of the microcontroller occurs by random sampling; and
the ascertained temperature dependence and the ascertained voltage dependence are used for stabilizing the clock frequency of a plurality of similar microcontrollers.

5. The method as claimed in claim 1, wherein:
for determining the temperature of the microcontroller, the temperature of the chip, on which the microcontroller is arranged, is measured.

6. The method as claimed in claim 1, wherein:
the microcontroller is clocked via a tunable digitally controlled oscillator.

7. The method as claimed in claim 1, wherein:
the ascertained temperature dependence and the ascertained voltage dependence of the clock frequency of the microcontroller are stored in a memory by storing the ascertained temperature and voltage dependences as a matching function of the measured clock frequencies and the corresponding measured voltages and temperatures.

8. The method as claimed in claim 1, wherein:
the ascertained temperature dependence and the ascertained voltage dependence of the clock frequency of the microcontroller are stored in a memory by storing the ascertained temperature and voltage dependences as a linear relationship of the measured clock frequencies and the corresponding measured voltages and temperatures.

* * * * *